(12) United States Patent
Salmon et al.

(10) Patent No.: US 7,117,401 B2
(45) Date of Patent: *Oct. 3, 2006

(54) METHOD AND APPARATUS FOR OPTIMIZING TIMING FOR A MULTI-DROP BUS

(75) Inventors: Joseph H. Salmon, Placerville, CA (US); Hing Y. To, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/121,789

(22) Filed: May 4, 2005

(65) Prior Publication Data

US 2005/0195677 A1    Sep. 8, 2005

Related U.S. Application Data

(63) Continuation of application No. 10/187,349, filed on Jun. 28, 2002, now Pat. No. 6,973,603.

(51) Int. Cl.
*H04L 1/24*    (2006.01)

(52) U.S. Cl. .................. 714/715; 714/709; 714/738

(58) Field of Classification Search ............... 714/738
See application file for complete search history.

(56) References Cited

U.S. PATENT DOCUMENTS 6,381,722 B1    4/2002    Salmon et al.

| | | |
|---|---|---|
| 2001/0017814 A1 | 8/2001 | Arimoto et al. |
| 2003/0005250 A1 | 1/2003 | Johnson et al. |
| 2003/0065988 A1 | 4/2003 | Kariquist |
| 2003/0091035 A1 | 5/2003 | Roy et al. |
| 2003/0152110 A1 | 8/2003 | Rune |

FOREIGN PATENT DOCUMENTS

| | | |
|---|---|---|
| EP | 0877503 | 5/1998 |
| JP | 63274237 | 11/1988 |

OTHER PUBLICATIONS

Jeske, D.R.; On Maximum-Likelihood Esimation of Clock Offset; Communications; IEEE Transactions on; vol. 53, Issue: 1 ISSN: 0090-6778; Jan. 2005; pp. 53-54.

*Primary Examiner*—R. Stephen Dildine
(74) *Attorney, Agent, or Firm*—Blakely, Sokoloff, Taylor & Zafman LLP

(57) ABSTRACT

A first device delivers a clock offset message to a second device. The second device offsets its data transmission according to the clock offset message. A test pattern is transmitted from the second device to the first device. The first device then checks the received test pattern to determine whether the transmission was successful. The first device can then deliver an additional clock offset message to the second device to instruct the second device to offset its data transmission by a different value than was used previously. The second device again transmits the test pattern and the first device again checks the received pattern. By trying a number of clock offset values and determining which values result in successful transmissions of data, the first device can determine the optimal clock offset value and instruct the second device to use this value for all transmissions.

20 Claims, 3 Drawing Sheets

METHOD AND APPARATUS FOR OPTIMIZING TIMING FOR A MULTI-DROP BUS

The present application is a Continuation of application Ser. No. 10/187,349, filed Jun. 28, 2002, now U.S. Pat. No. 6,973,603 entitled "Method and Apparatus for Optimizing Timing for a Multi-Drop Bus", and claims priority thereof.

FIELD OF THE INVENTION

The present invention pertains to the field of semiconductor devices. More particularly, this invention pertains to the field of reducing communication errors on a computer system bus.

BACKGROUND OF THE INVENTION

One important element in designing today's computer systems is minimizing channel error (errors occurring during data transfers) on multi-drop busses. Multi-drop busses typically connect one device to two or more other devices. Impedance discontinuities along the bus can create a standing wave on a clock signal, thereby degrading clock signal integrity and skewing the clock signal with respect to data signals. This skew may result in a master device latching data from a slave device at a time other than an optimal time, and increased channel error results.

Prior techniques for dealing with clock skew introduced by impedance discontinuities include reducing the maximum allowable clock frequency on the bus to ensure that valid data is latched at the receiving device. Of course, a reduction in clock frequency results in decreased bus performance, and is therefore undesirable.

BRIEF DESCRIPTION OF THE DRAWING

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

In general, the embodiments discussed below are examples of a technique for minimizing channel error by skewing the transmission or reception of data in relation to a clock signal to ensure that the data is valid at the receiving device when the receiving device latches the data. This is accomplished in one embodiment by centering the data eye (defined as the period of time during which the data is valid at the receiving device) around the time when the data is to be latched at the receiving device. In one example embodiment, a first device delivers a clock offset message to a second device. The second device offsets its data transmission according to the clock offset message. A test pattern is transmitted from the second device to the first device. The first device then checks the received test pattern to determine whether the transmission was successful. The first device can then deliver an additional clock offset message to the second device to instruct the second device to offset its data transmission by a different value than was used previously. The second device again transmits the test pattern and the first device again checks the received pattern. By trying a number of clock offset values and determining which values result in successful transmissions of data, the first device can determine the optimal clock offset value and instruct the second device to use this value for all transmissions.

Once successful transmission has been assured from the second device to the first device, a test pattern can be written from the first device to the second device and then read back from the second device to the first device to check for successful transmission from the first device to the second device. The first device may instruct the second device via a clock offset message to offset the latching in of data received from the first device by an amount of time specified in the clock offset message. Various clock offset times can be tried to determine an optimal value.

Figure 1:
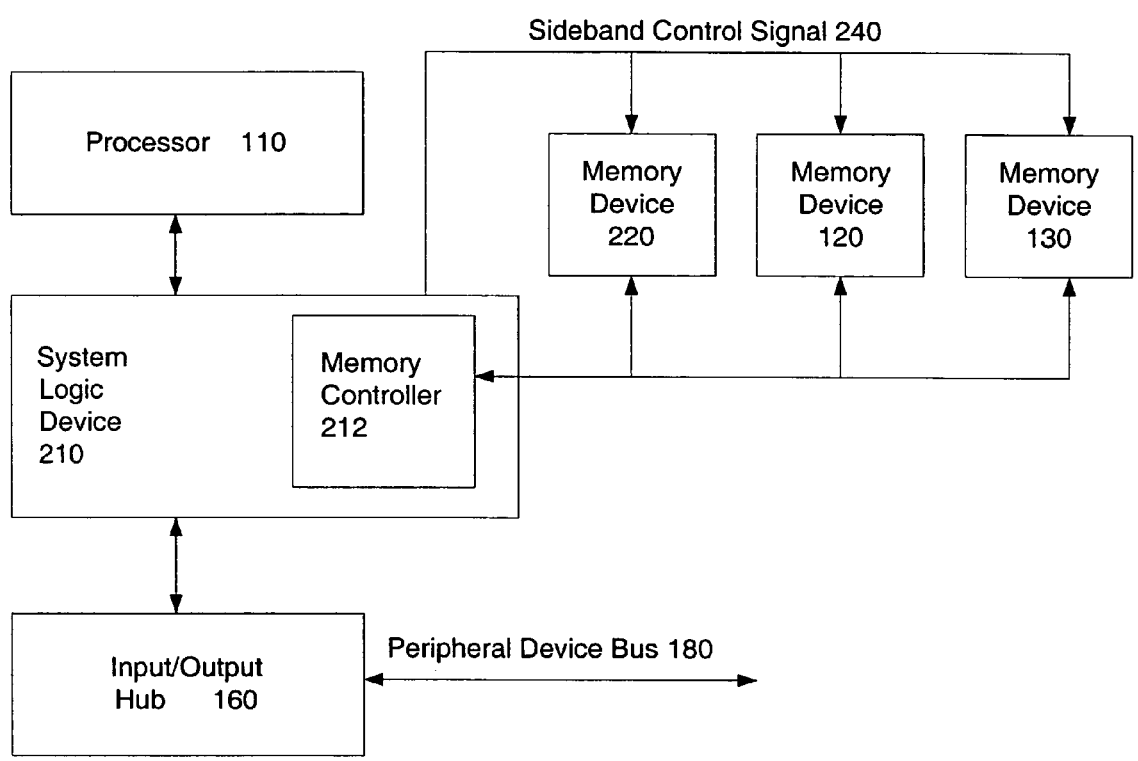
FIG. 1 is a block diagram of a computer system including a system logic device coupled to several memory devices.

FIG. 1 is a block diagram of a computer system 100 that includes a processor 110 coupled to a system logic device 210. The system logic device 210 is coupled to an input/output hub 160. The input/output hub 160 may provide communication with various peripheral components (not shown) over a peripheral device bus 180.

The system logic device 210 includes a memory controller 212 that is coupled to memory devices 220, 120, and 130 via a memory bus 230. The memory controller 212 is also coupled to the memory devices 220, 120, and 130 via a sideband control signal 240. The sideband control signal 240 may be implemented as a low-frequency bus used to communicate control instructions from the memory controller 212 to the memory devices 220, 120, and 130.

Figure 2:
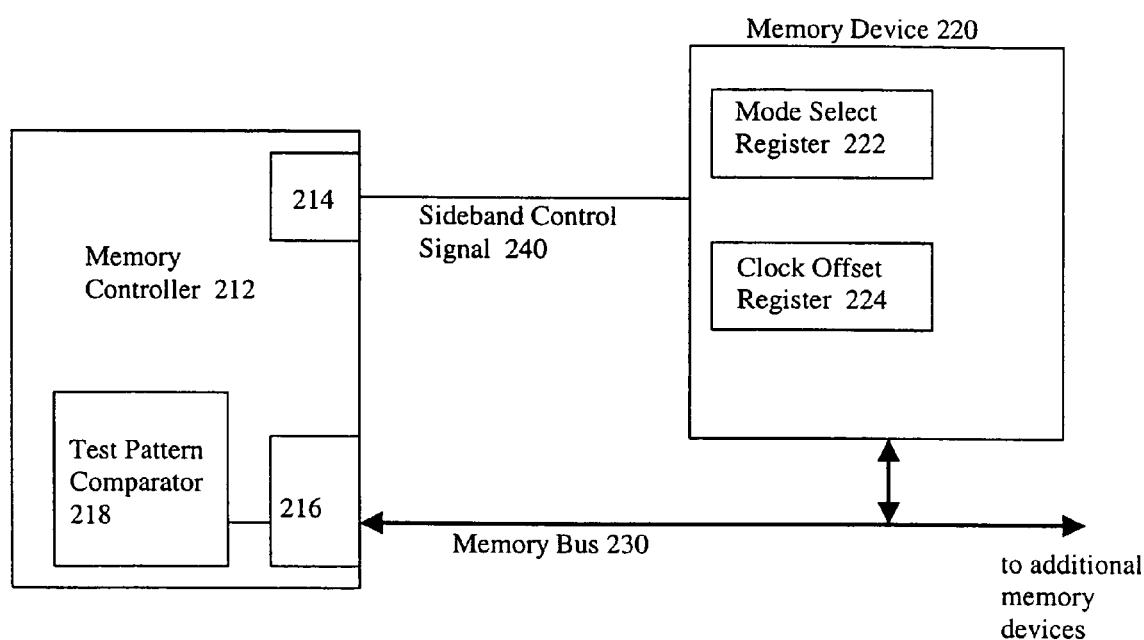
FIG. 2 is a block diagram of a memory controller coupled to a memory device.

FIG. 2 is an expanded view of the memory controller 212 and the memory device 220. The memory controller 212 includes a sideband control signal output unit 214 and a memory bus input/output unit 216. The sideband control signal output unit 214 provides communication with the memory device 220 via the sideband control signal 240. The memory bus input/output unit 216 transmits data to and receives data from the memory device 220 over the memory bus 230. The memory bus 230 may include a number of data lines and at least one clock line.

The memory controller 212 further includes a test pattern comparator unit 218 and the memory device 220 further includes a mode select register 222 and a clock offset register 224.

For this example embodiment, in order to optimize read and write timing on the memory bus, the memory controller 212 first delivers a clock offset message to the memory device 220 via the sideband control signal 240. The clock offset message instructs the memory device 220 to place a transmit clock offset value (included in the clock offset message) into the clock offset register 224. The transmit clock offset value represents a period of time by which the memory device 220 internal data transmission clock is offset.

The memory controller 212 then delivers a test mode message to the memory device 220 via the sideband control signal 240. The test mode message indicates to the memory device 220 to place a mode select value into the mode select register 222. The test mode message includes a mode select value that instructs the memory device 220 to enter a test mode. The test mode causes the memory device 220 to transmit a predetermined test pattern to the memory controller 212 over the memory bus 230. This transmission occurs with the transmission being offset by the transmit clock offset value stored in the clock offset register. If the transmission would normally occur at time t=0, then with an example transmit clock offset value of 15 picoseconds the test pattern would be transmitted at time t=0+15 picoseconds. A wide range of offset values are possible, including values that would cause the transmission to occur prior to t=0 (i.e., t=0−15 picoseconds). For this embodiment, the transmit clock offset may be accomplished via a delay lock loop circuit. The delay lock loop circuit alters the timing of a transmit clock signal that is internal to the memory device 220.

The memory controller 212 receives the test pattern and the test pattern comparator unit 218 determines whether the transmission was successful by comparing the received pattern with a predetermined pattern. The test pattern comparator unit 218 then stores the pass/fail result.

The memory controller 212 may perform many iterations of the above process trying a number of different transmit clock offset values. With the results of the various iterations stored in the test pattern comparator unit 218, the memory controller 212 can determine an optimal value for the transmit clock offset for memory device 220.

Once the timing for transmissions from the memory device 220 to the memory controller 212 has been optimized, the timing for transmissions from the memory controller 212 to the memory device 220 may be optimized. The memory controller 212 delivers a receive clock offset value via a clock offset message to the memory device 220 over the sideband control signal 240. The receive clock offset value is stored in the clock offset register 224. The memory controller 212 then delivers a predetermined test pattern to the memory device 220. The memory controller 212 then reads back the test pattern from the memory device 220 and the test pattern comparator unit 218 checks the received test pattern against the predetermined pattern. Because the timing for transmissions from the memory device 220 to the memory controller 212 was previously optimized, any errors found by the test pattern comparator unit 218 can be attributed to errors occurring during the transmission from the memory controller 212 to the memory device 220.

The memory controller 212 may try a number of different receive clock offset values for the memory device 220. The results of these attempts are stored in the test pattern comparator unit 218. The memory controller 212 can then determine an optimal value for the receive clock offset for the memory device 230. For this embodiment, the receive clock offset may be accomplished via a delay lock loop circuit. The delay lock loop circuit alters the timing of a receive clock signal that is internal to the memory device 230.

The above procedures for minimizing channel error between the memory controller 212 and the memory device 230 may be repeated for all other devices attached to the memory bus 230.

The procedures described herein for minimizing channel error may be accomplished using a combination of hardware and software. Hardware only embodiments are also possible.

Although the embodiments discussed above in connection with FIGS. 1 and 2 include optimizing timings between a memory controller and a memory device, other embodiments are possible where timings are optimized among a wide variety of devices.

Figure 3:
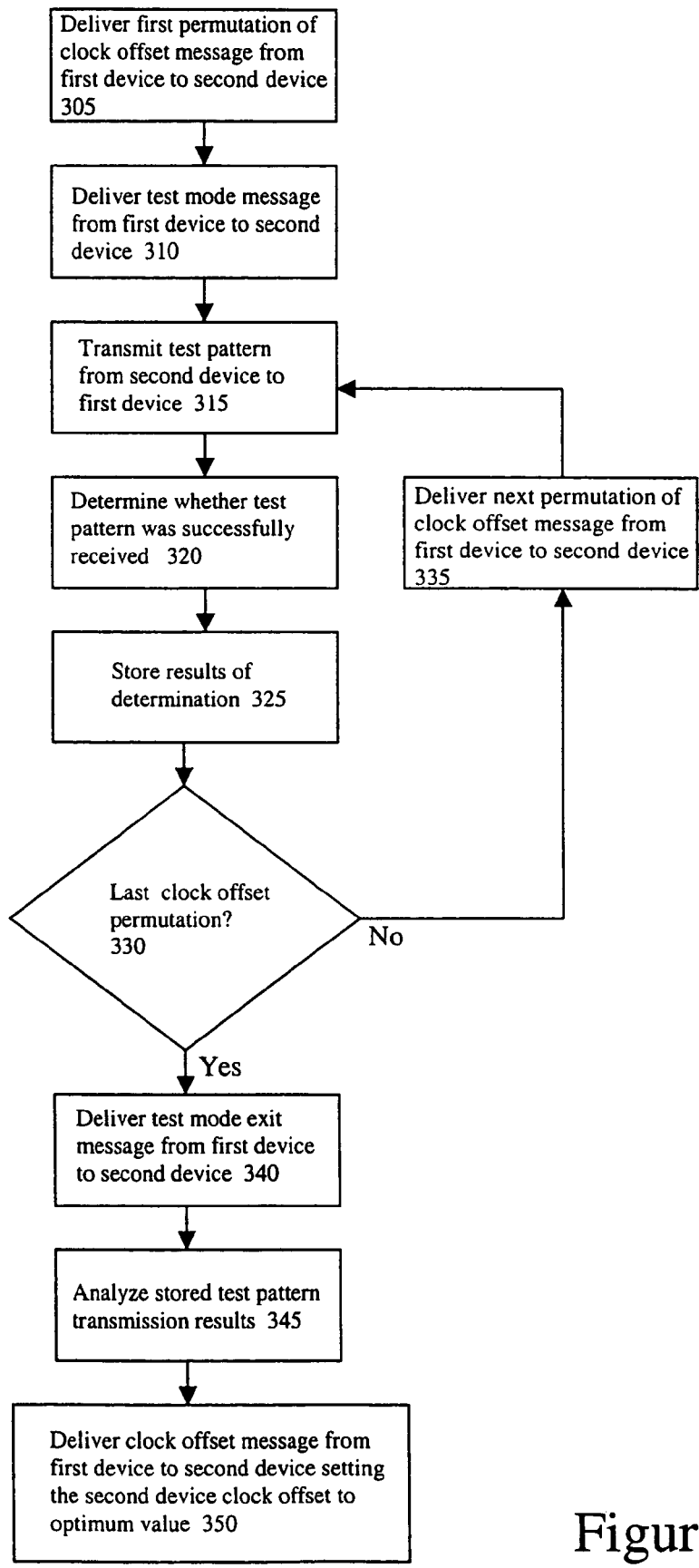
FIG. 3 is a flow diagram of one embodiment of a method for minimizing channel error.

FIG. 3 is a flow diagram of one embodiment of a method for minimizing channel error between a first device and a second device. At block 305, a first permutation of a clock offset message is delivered from a first device to a second device. A test mode message is delivered from the first device to the second device at block 310. At block 315, a test pattern is transmitted from the second device to the first device.

At block 320, a determination is made as to whether the test pattern was successfully received. The results of the determination are stored at block 325.

Block 330 indicates that if the last permutation has been performed, then processing proceeds to block 340. If additional permutations remain, then processing proceeds to block 335. At block 335, a next permutation of the clock offset message is delivered from the first device to the second device. Then, processing returns to block 315.

Following the processing of the last permutation, then at block 340 a test mode exit message is delivered from the first device to the second device. The stored test pattern transmission results are analyzed at block 345. Finally, a clock offset message is delivered from the first device to the second device, thereby setting the second device clock offset to an optimal value.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than in a restrictive sense.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances of "an embodiment," "one embodiment," or "some embodiments" are not necessarily all referring to the same embodiments.

What is claimed is:

1. A memory device comprising:
   a sideband control signal input; and
   a test pattern generator to transmit a test pattern in response to a test mode message being received at the sideband control signal input.

2. The memory device of claim 1, further comprising a bus interface to transmit the test pattern.

3. The memory device of claim 2, further comprising a clock offset register.

4. The memory device of claim 3 wherein the test pattern output is offset according to a value stored in the clock offset register.

5. The memory device of claim 4, wherein the clock offset register is updateable by receiving an offset value message via the sideband control signal input.

6. The memory device of claim 1, further comprising a mode select register to receive a test mode select value.

7. A memory controller comprising:
   a sideband control signal output unit to transmit a clock offset message to a memory device; and
   a test pattern comparator unit to determine whether a test pattern received from the memory device matches a predetermined pattern.

8. The memory controller of claim 7 wherein the sideband control signal output transmits a test mode message to the memory device.

9. The memory controller of claim 8 further comprising a bus interface unit to receive a test pattern from an external device.

10. The memory device of claim 7 wherein the test pattern is offset according to a value corresponding to the clock offset message.

11. A system, comprising:
a memory device having:
a sideband control signal input coupled to a sideband control signal,
a clock offset register, and
a test pattern generator to transmit a test pattern in response to a test mode message being received at the sideband control signal input; and
a memory controller having:
a sideband control signal output unit to transmit a clock offset message to the memory device and to deliver a test mode message to the memory device; and
a test pattern comparator unit to determine whether the received test pattern matches a predetermined pattern.

12. The system 11 wherein the memory device further comprises a bus interface unit to transmit the test pattern.

13. The system 12 wherein the memory device further comprises a mode select register to store the test mode value.

14. The system 11 wherein the memory controller further comprises a bus interface unit to receive the test pattern from the memory device.

15. The system of claim 11 wherein the test pattern output transmitted from the memory device is offset according to a value stored in the clock offset register.

16. The system of claim 15, wherein the clock offset register is updateable by receiving the clock offset message transmitted by the memory controller over the sideband control signal.

17. A method, comprising:
transmitting a test mode message from a memory controller to a memory device;
receiving a test pattern from the memory device to the memory controller; and
determining whether the test pattern received at the memory controller matches a predetermined pattern.

18. The method of claim 17, further comprising storing the results of the determination whether the test pattern received at the memory controller matches the predetermined pattern.

19. The method of claim 17, further comprising analyzing the stored results to determine an optimum clock offset value.

20. The method of claim 17, further comprising transmitting a test mode exit message from the memory controller to the memory device.

* * * * *